(12) United States Patent
Alfredsson et al.

(10) Patent No.: US 11,638,361 B2
(45) Date of Patent: Apr. 25, 2023

(54) LOCKING MECHANISM FOR MODULE CARDS FOR GRID AUTOMATIONS PRODUCTS

(71) Applicant: Hitachi Energy Switzerland AG, Baden (CH)

(72) Inventors: Fredrik Alfredsson, Västerås (SE); Jimmy Kjellsson, Västerås (SE); Daniel Wahlberg, Västerås (SE); Michael Carlsson, Bålsta (SE)

(73) Assignee: Hitachi Energy Switzerland AG, Baden (CH)

( * ) Notice: Subject to any disclaimer, the term of this patent is extended or adjusted under 35 U.S.C. 154(b) by 0 days.

(21) Appl. No.: 17/791,610

(22) PCT Filed: Jan. 13, 2021

(86) PCT No.: PCT/EP2021/050548
§ 371 (c)(1),
(2) Date: Jul. 8, 2022

(87) PCT Pub. No.: WO2021/151666
PCT Pub. Date: Aug. 5, 2021

(65) Prior Publication Data
US 2023/0040890 A1    Feb. 9, 2023

(30) Foreign Application Priority Data
Jan. 31, 2020   (EP) .................................. 20154894

(51) Int. Cl.
*H05K 7/14*   (2006.01)

(52) U.S. Cl.
CPC .................................. *H05K 7/1408* (2013.01)

(58) Field of Classification Search
None
See application file for complete search history.

(56) References Cited

U.S. PATENT DOCUMENTS

| 4,155,109 | A | * | 5/1979 | Finch | H05K 7/1408 361/802 |
|---|---|---|---|---|---|
| 5,317,483 | A | | 5/1994 | Swindler | |
| 7,039,291 | B1 | * | 5/2006 | Georgiano | G02B 6/444 220/4.01 |
| 7,075,796 | B1 | * | 7/2006 | Pritchett | H05K 7/1408 361/756 |

(Continued)

FOREIGN PATENT DOCUMENTS

| CH | 667959 A5 | 11/1988 |
|---|---|---|
| CN | 1940811 A | 4/2007 |

(Continued)

*Primary Examiner* — Xanthia C Cunningham
(74) *Attorney, Agent, or Firm* — Slater Matsil, LLP (57) ABSTRACT

A locking arrangement can be used for securing electric module cards between two side walls of a housing. The locking arrangement includes two side members for fixed arrangement with the respective side walls. An opening defined between the side members accommodates electric contacts of the electric module cards. A first and a second transverse member form a frame with the side members in order to lock the electric module cards within the housing. A locking mechanism is detachably connects at least one of the transverse members to at least one of the side members by means of a snap-fit.

20 Claims, 5 Drawing Sheets

(56) References Cited

U.S. PATENT DOCUMENTS

| | | | |
|---|---|---|---|
| 7,983,053 B2* | 7/2011 | Joist | H05K 7/1407 |
| | | | 333/260 |
| 9,801,296 B1* | 10/2017 | Wu | H05K 5/0013 |
| 2002/0030976 A1* | 3/2002 | Boe | G06F 1/185 |
| | | | 361/752 |
| 2003/0052578 A1* | 3/2003 | Hung | H05K 7/1408 |
| | | | 312/328 |
| 2007/0090268 A1* | 4/2007 | Sun | H05K 7/1408 |
| | | | 248/560 |
| 2008/0160808 A1 | 7/2008 | Hsiao | |
| 2008/0278907 A1* | 11/2008 | Shih | G06F 1/186 |
| | | | 361/759 |
| 2010/0124014 A1* | 5/2010 | Kuo | H05K 7/1408 |
| | | | 361/679.58 |
| 2011/0008103 A1* | 1/2011 | Cheng | G06F 1/186 |
| | | | 403/325 |
| 2011/0103012 A1 | 5/2011 | Kuo et al. | |
| 2011/0170271 A1* | 7/2011 | Lee | H05K 7/1408 |
| | | | 361/756 |

FOREIGN PATENT DOCUMENTS

| | | |
|---|---|---|
| CN | 101959387 A | 1/2011 |
| CN | 103220939 A | 7/2013 |
| DE | 2757761 A1 | 6/1979 |
| DE | 9412285 U1 | 10/1994 |
| JP | S58074385 U | 5/1983 |
| JP | S60106390 U | 7/1985 |
| JP | S63115286 U | 7/1988 |

\* cited by examiner

LOCKING MECHANISM FOR MODULE CARDS FOR GRID AUTOMATIONS PRODUCTS

CROSS-REFERENCE TO RELATED APPLICATIONS

This application is a national stage application of International Application No. PCT/EP2021/050548, filed on Jan. 13, 2021, which claims priority to European Patent Application No. 20154894.8, filed on Jan. 31, 2020, which applications are hereby incorporated herein by reference.

TECHNICAL FIELD

The present disclosure generally relates to a locking mechanism for module cards for grid automations products.

BACKGROUND

An electric device for a distribution grid automation system, such as a protective relay, typically comprises a housing in which a plurality of electric module cards are placed. The electric module cards are usually fastened to the housing directly with screws. Alternatively, a metal plate is arranged over all the electric module cards and the metal plate is then fastened to the housing with screws. In any case, in order to exchange one or more of electric module cards in a service situation, the screws need to be removed and then fastened again after the exchange of the one or more electric module cards.

The unscrewing and screwing of the screws risk generation of metal chips that might be spread inside the housing. If this service situation occurs often, the risk of metal chips being spread inside the housing is quite high. The metal chips can potentially generate an electric short-circuit inside the electric device which will most likely damage the electric module cards or other electric components and result in a defect electric device. Also, if a metal plate is used is provided over the electric module cards, and the metal plate comprises an opening for each electric contact of the electric module cards, the level if difficulty for electric module card replacement is high. Moreover, the time it takes to replace one electric module card is quite long since all electric contacts, even for electric module cards that are not to be replaced, passing through the metal plate have to be disconnected and subsequently connected. Furthermore, in case each electric module card is fastened by screws, the replacement time becomes long.

SUMMARY

The present disclosure generally relates to a locking arrangement. In particular embodiments, the disclosure relates to a locking arrangement for securing electric module cards between two side walls of a housing, a housing for accommodating electric module cards, and an electric device comprising a housing, are provided.

Embodiments of the present disclosure can provide a locking arrangement for securing electric module cards inside a housing, which locking arrangement may allow for a simple removal and/or addition of one or more electric module cards.

Particular embodiment of the present disclosure provide a locking arrangement for securing electric module cards inside a housing, which locking arrangement may allow for a fast removal and/or addition of one or more electric module cards.

Further embodiments of the present disclosure provide a locking arrangement for securing electric module cards inside a housing, which locking arrangement may allow for a toolless removal and/or addition of one or more electric module cards.

Further embodiments of the present disclosure provide a locking arrangement for securing electric module cards inside a housing, which locking arrangement may allow for a more reliable functioning of an electric device comprising the housing and the electric module cards.

Still further embodiments of the present disclosure provide a locking arrangement for securing electric module cards inside a housing, which locking arrangement may reduce the risk of spreading chips inside the housing.

Still further embodiments of the present disclosure provide a locking arrangement for securing electric module cards inside a housing, wherein the locking arrangement may have a simple, reliable, cheap and/or compact design.

Still further embodiments of the present disclosure provide a locking arrangement for securing electric module cards inside a housing, which locking arrangement solves several or all of the foregoing objects in combination.

Still further embodiments of the present disclosure provide a housing for accommodating electric module cards, which housing solves one, several or all of the foregoing objects.

The embodiments can be combined so that any particular implementation can include one, several or all of the foregoing embodiments. An example embodiment provides a locking arrangement that can be used for securing electric module cards between two side walls of a housing. The locking arrangement includes two side members for fixed arrangement with the respective side walls. An opening accommodates electric contacts of the electric module cards. The opening is defined between the side members. A first and a second transverse member form a frame with the side members in order to lock the electric module cards within the housing. A locking mechanism is detachably connects at least one of the transverse members to at least one of the side members by means of a snap-fit.

BRIEF DESCRIPTION OF THE DRAWINGS

Further details, advantages and aspects of the present disclosure will become apparent from the following embodiments taken in conjunction with the drawings, wherein.

DETAILED DESCRIPTION

In the following, a locking arrangement for securing electric module cards between two side walls of a housing, a housing for accommodating electric module cards, and an electric device comprising a housing, will be described. The same or similar reference numerals will be used to denote the same or similar structural features.

Embodiments will first be discussed followed by a description of each of the drawings.

Figure 1:
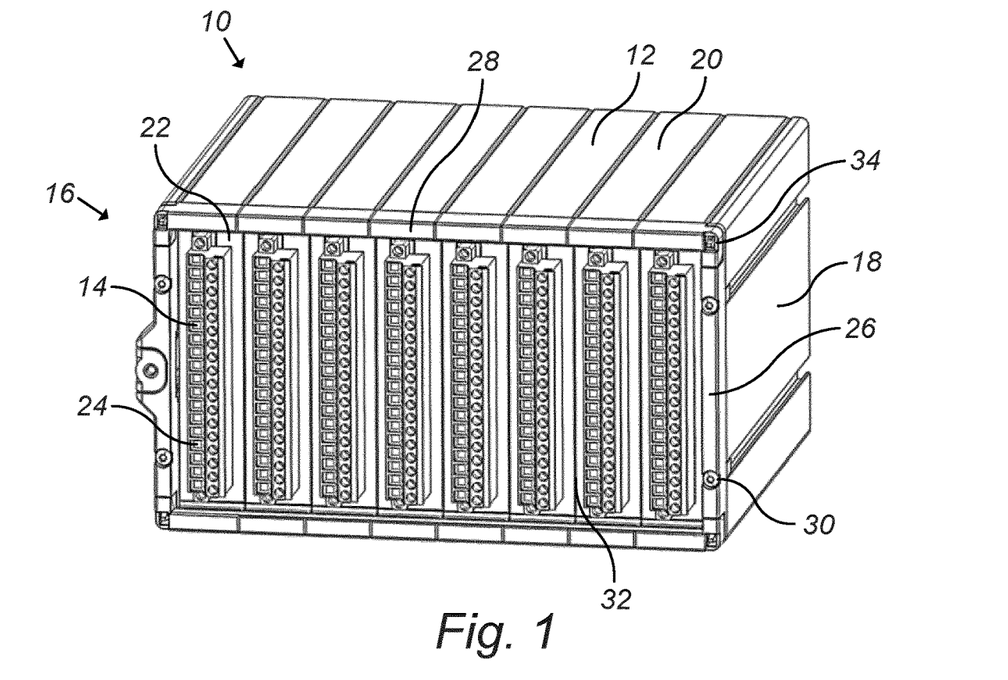
FIG. 1 schematically represents a perspective front view of an electric device comprising a housing and a locking arrangement.

As shown in FIG. 1, according to one aspect, a locking arrangement 16 is provided for securing electric module cards 14 between two side walls 18 of a housing 12. The locking arrangement 16 comprises two side members 26 for fixed arrangement with the respective side walls 18. An opening 32 accommodates electric contacts 24 of the electric module cards 14 defined between the side members 26. At least one transverse member 28 is configured to selectively bridge between the side members 26 in order to lock the electric module cards 14 within the housing 12. At least one locking mechanism 34 is configured to detachably connect the at least one transverse member 28 to one of the side members 26 by means of a snap-fit when the at least one transverse member 28 bridges between the side members 26.

In order to exchange an electric module card inside the housing 12, a user releases the at least one locking mechanism 34 of each of the at least one transverse member 28. The user then entirely or partially removes the at least one transverse member 28 such that the at least one transverse member 28 no longer bridges between the side members 26 and locks the electric module cards 14. The electric module card to be replaced is then pulled out from the housing 12 and a new electric module card is then inserted into the housing 12. The user then moves the at least one transverse member 28 to again bridge between the side members 26 and connects the at least one transverse member 28 to at least one of the side members 26 by means of the snap-fit locking mechanism 34. The electric module cards 14 are then again secured inside the housing 12. The entire exchange process can be performed without needing to screw or unscrew any screws (e.g., screws for electric module cards 14 and/or screws for a metal plate provided over the electric module cards 14). Thereby, the risk of metal chips being spread inside the housing 12 is eliminated and the functioning of an electric device comprising the housing 12 becomes more reliable.

Furthermore, the entire exchange process can be performed by only moving the at least one transverse member 28. The locking arrangement 16 enables the side members 26 to not have to be removed in order to exchange one or more module cards 14 inside the housing 12. Since the at least one locking mechanism 34 comprises a snap-fit connection, the entire exchange process can be carried out in a simple and fast manner, e.g., without using tools by manipulating the at least one locking mechanism 34s by human fingers. Due to the opening 32 defined between the side members 26, any cables connected to electric contacts 24 of module cards 14 that should not be replaced can be maintained connected through the entire exchange process. This also contributes to a simple and fast exchange process.

The housing 12 may comprise a space defined between the two side walls 18. The plurality of electric module cards 14 may be accommodated in this space. In addition to the opposing side walls 18, the housing 12 may comprise a top wall 20 and a bottom wall 38 (see FIG. 3). According to one example, the housing 12 is extruded. The housing 12 may be made of aluminum.

Each of the top wall 20 and the bottom wall 38 may span between the side walls 18. The top wall 20 and the bottom wall 38 may be substantially perpendicular to, or perpendicular to, the side walls 18. In case the electric module cards 14 comprises back plates 22, the back plates 22 may bridge between the top wall 20 and the bottom wall 38. Furthermore, all back plates 22 may be provided between the side members 26.

Each electric module card may further comprise at least one electric contact 24. The at least one transverse member 28 may be provided over the back plates 22 of the module cards 14, i.e., adjacent to the electric contacts 24, when locking the electric module cards 14. Instead of providing an opening 32 in the transverse member 28 for accommodating one or more electric contacts 24 of the electric module cards 14, the at least one transverse member 28 is provided next to the electric contacts 24 and the opening 32 between the side members 26 is used to accommodate the electric contacts 24 of the module cards 14.

The at least one transverse member 28 may be formed in one piece, e.g., of aluminum. The side members 26 may be integrally formed with the side walls 18, or may be connected to the side walls 18. In the latter case, each side member 26 may be formed in one piece, e.g., of aluminum. Each of the at least one transverse member 28 may lock all electric module cards 14 within the housing 12.

The at least one transverse member 28 may be provided with one or more slot indication features, such as numbers. When the at least one transverse member 28 bridges the side members 26, the slot indication features may be aligned with associated slots inside the housing 12 for receiving the electric module cards 14.

Each side member 26 may be aligned with a respective side wall, e.g., to cover an end thereof. Alternatively, or in addition, each side member 26 may be substantially parallel with, or parallel with, a respective side wall.

Similarly, the at least one transverse member 28 may be aligned with a respective bottom or top wall 20 of the housing 12, e.g., to cover an end thereof. Alternatively, or in addition, the at least one transverse member 28 may be substantially parallel with, or parallel with, a respective top wall 20 or bottom wall 38.

The opening 32 defined between the side members 26 may extend all the way between the side members 26 regardless of whether or not the at least one transverse member 28 is connected to the side members 26. The opening 32 can accommodate a plurality of electric contacts 24, such as all electric contacts 24 at back plates 22 of the electric module cards 14 when the electric module cards 14 are accommodated in the housing 12.

The at least one transverse member 28 may comprise two transverse members 28. The transverse members 28 and the side members 26 may form a frame. In this case, the frame may define the opening 32 for accommodating electric contacts 24 of the electric module cards 14 when the transverse members 28 bridge between the side members 26.

Each of the at least one transverse member 28 may be elongated. Thus, the at least one transverse member 28 may be a locking bar. In case more than one transverse member 28 is provided, each transverse member 28 may be of the same length. Each of the at least one transverse member 28 may be longer than each side member 26.

Each of the side members 26 may be elongated. The side members 26 may be of the same length.

The at least one locking mechanism 34 may comprise a locking mechanism at each connection between the at least one transverse member 28 and the side members 26. As a possible alternative, the at least one transverse member 28 may be hinged to one side members 26 and connectable to the other side members 26 by means of the locking mechanism 34.

Figure 4:
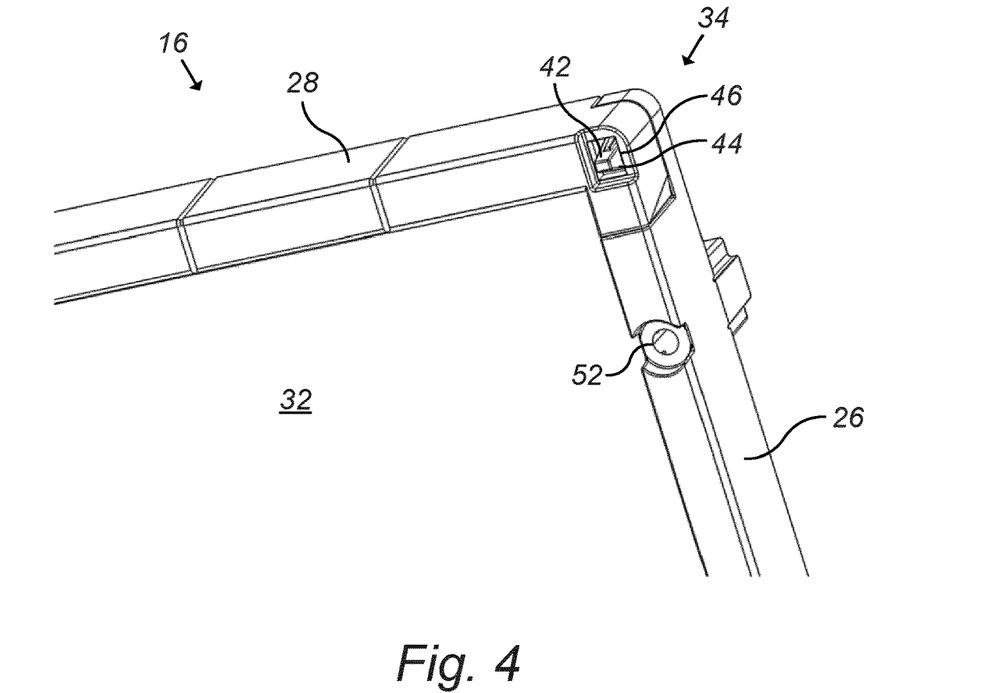
FIG. 4 schematically represents a partial perspective front view of the locking arrangement.

The at least one locking mechanism 34 may comprise a flexible locking element 42 (see e.g., FIG. 4). In case the locking element 42 is provided in the at least one transverse member 28, the entire transverse member 28 except the locking element 42 may be rigid and each side member 26 may be entirely rigid. In case the locking element 42 is provided in one of the side members 26, the entire transverse member 28 may be rigid and the side members 26 except the locking element 42 may be rigid. The locking element 42 may be a tongue 91 (see e.g., FIG. 9).

The locking element 42 may comprise a hook 44 and the locking mechanism 34 may further comprise a wedge 48 arranged to be engaged by the hook 44. The locking element 42 may be provided in the transverse member 28 if the wedge 48 is provided in the side members 26, and vice versa.

The locking mechanism 34 may further comprise a hole 46 for accessing the locking element 42. The hole 46 may be provided in the same part (transverse member 28 or side members 26) as the wedge 48 or in the same part as the locking element 42.

The locking element 42 may be configured to be released by means of a human finger when the at least one transverse member 28 is connected to the side members 26. To this end, the locking element 42 may protrude outside the transverse member 28 and/or the side members 26 when the transverse member 28 bridges between the side members 26. Alternatively, or in addition, the locking element 42 may be arranged at an exterior part of the transverse member 28 and/or the side members 26 when the transverse member 28 bridges between the side members 26.

The locking element 42 may alternatively, or in addition, be configured to be released by means of a flat-bladed screwdriver or other tool without unscrewing any screws.

The locking mechanism 34 may in some examples be configured to detachably connect the at least one transverse member 28 to a first one of the side members 26 by means of a protruding element that is fitted in a recess 48, and to the other side members 26 by means of a snap-fit. The protruding element may for example be a tongue 91, ridge or pin and the recess 48 a groove 92 or slot configured to receive at least a part of the protruding element.

The snap-fit may be understood as a type of joint in which interlocking components are pushed together to form a joint. The interlocking components may for example comprise a protruding edge 44 and a snap-in area, or a recess 48, in which the protruding edge 44 can be engaged. The cantilever snap-fit is an example of a snap-fit joint, in which a flexible element 42, such as a lever or pin, can be pushed into a receiving area in which it can be engaged to limit relative motion of the parts that are snap-fitted together. To undo or release the snap-fit, the flexible element 42 may be pushed or bent such that it is released from the receiving area. The snap-fit joint is advantageous in that requires no separate or loose parts and provides a relatively fast technique for attaching and detaching a transverse member 28 to a side members 26.

In one example, the snap-fit is formed of a protruding edge 44 and a recess 48 configured to be engaged with each other, wherein the protruding edge 44 may be arranged on, or be integrally formed with, the transverse member 28 and the recess 48 be arranged on, or be integrally formed with, the side members 26. Alternatively, the protruding edge 44 may be arranged on, or be integrally formed with, the side members 26 and the recess 48 be arranged on, or be integrally formed with, the transverse member 28.

A tongue 91 and groove 92 joint may refer to a type of joint that is formed by a protruding element, such as a tongue 91, and a recess 48, such as a groove 92, that are configured to be engaged with each other to limit relative movement of the parts that are attached to each other by the joint. Thus, the protruding element may be arranged on, or be integrally formed with, the transverse member 28 and the recess 48 be arranged in, or integrally formed with, the side members 26, or vice versa. The recess 48 may be a groove 92 or slot configured to receive at least a part of the protruding element or tongue 91, which also may be a ridge, a pin or the like, in order to limit relative motion between the transverse member 28 and the side members 26.

In an example, the tongue 91 and groove 92 joint may be configured to limit or prevent motion of the transverse member 28 in a plane perpendicular to a length extension of the transverse member 28, whereas the snap-fit joint may be configured to limit or prevent motion of the transverse member 28 in a direction parallel to the length extension of the transverse member 28.

The side members 26 may be detachably connectable to the respective side walls 18. Each side member 26 may be arranged to be fastened to one of the side walls 18 by means of a screw. The screws may directly or indirectly fasten the side members 26 to the side walls 18. For example, each side member 26 comprises at least one screw hole 52 for receiving a screw 30 in order to fasten the side members 26 to one of the side walls 18. In a service situation requiring exchange of an electric module card, the locking arrangement 16 enables this exchange without requiring to loosening the screws securing the side members 26.

According to a further aspect, a housing 12 is provided for accommodating electric module cards 14. The housing 12 comprises two side walls 18. A locking arrangement 16 as discussed herein can be used for securing the electric module cards 14 between the two side walls 18. The side members 26 are fixedly connected to the respective side walls 18.

The housing 12 may be configured such that the at least one transverse member 28 can be connected to the one of the side members 26 by means of the locking mechanism 34, and can be detached from the one of the side members 26 by means of the locking mechanism 34, without detaching any of the side members 26 from the respective side wall.

According to a further aspect, an electric device comprises a housing 12 according to the present disclosure. The electric device may be a protective relay, also known as intelligent electronic device (IED), arranged in a distribution grid automation system. The protective relay may be configured with software to provide protection and control features in the system. The protective relay may be used for detecting a fault condition and tripping power to an electrical equipment or a power line being protected with help of a circuit breaker.

The electric device may further comprise at least one electric module card accommodated between the two side walls 18. The electric module card may comprise a printed circuit board (PCB).

The at least one electric module card may comprise a back plate 22. In this case, the at least one transverse member 28 may be configured to lock the at least one electric module card within the housing 12 by locking the back plate 22.

The back plate 22 may be provided with a grip feature on each side. In this case, at least one grip feature may be blocked by the at least one transverse member 28. According to one variant, each back plate 22 comprises a grip feature adjacent to the top wall 20 and a grip feature adjacent to the bottom wall 38. Each grip feature may be integrally formed with the associated back plate 22.

In case the locking arrangement 16 comprises two transverse members 28, a top transverse member 28 may lock all grip features adjacent to the top wall 20 and a bottom transverse member 28 may lock all grip features adjacent to the bottom wall 38. This enables a compact design of the locking arrangement 16 and of the electric device. Each grip feature may be a handle, such as a recess 48 for receiving one or more fingers of a user.

The figures will now be described.

FIG. 1 schematically represents a perspective front view of an electric device 10. The electric device 10 comprises a housing 12, a plurality of electric module cards 14 (eight in FIG. 1) and a locking arrangement 16. The electric device 10 is here exemplified as a protective relay for a distribution grid automation system.

The housing 12 comprises two opposing vertical side walls 18. A space is defined between the side walls 18 into which the electric module cards 14 are inserted. The housing 12 of this example further comprises a horizontal top wall 20 and a horizontal bottom wall (not visible in FIG. 1). The housing 12 may be produced by aluminum extrusion.

Each electric module card 14 comprises a back plate 22 and an electric contact 24 provided on the back plate 22. Each electric module card 14 comprises a PCB. Each back plate 22 bridges between the top wall 20 and the bottom wall.

The locking arrangement 16 is configured to secure the electric module cards 14 inside the housing 12. The locking arrangement 16 of this example comprises two elongated side members 26 and two elongated transverse members 28 connected to form a frame. In FIG. 1, the side members 26 are vertical and the transverse members 28 are horizontal. The electric device 10 may however be oriented arbitrarily in space.

Each side member 26 is fixed to a respective side wall 18. The side members 26 are elongated and of the same length. As shown in FIG. 1, each side member 26 is aligned with, and covers, an end of an associated side wall 18.

In this example, each side member 26 comprises two screw holes. A screw 30 is provided in each screw hole to secure the side members 26 to the respective side walls 18.

The back plates 22 are arranged tightly next to each other. All the back plates 22 are arranged between the side members 26. One transverse member 28 bridges between the side members 26 and blocks the back plates 22 of all electric module cards 14 above the electric contacts 24. One transverse member 28 bridges between the side members 26 and blocks the back plates 22 of all electric module cards 14 below the electric contacts 24. In this way, the electric module cards 14 are locked and secured inside the housing 12.

An opening 32 is defined between the side members 26. In this example, the opening 32 is also defined by the frame formed by the side members 26 and the two transverse members 28. As shown in FIG. 1, all electric contacts 24 are positioned in the same opening 32. The electric contacts 24 need not necessarily be perfectly aligned with the frame in a depth direction (i.e., a direction perpendicular to the frame).

The locking arrangement 16 of this example further comprises four locking mechanisms 34. Each locking mechanism 34 is provided at a connection between one of the transverse members 28 and one of the side members 26. Thus, in this case where the transverse members 28 and the side members 26 form a frame, one locking mechanism 34 is provided at each corner of the frame.

Each locking mechanism 34 is configured to detachably connect one of the transverse members 28 to one of the side members 26 by means of a snap-fit. By releasing the snap-fit connection of each locking mechanism 34, the transverse members 28 can be removed. Thus, each transverse member 28 can be connected to the side members 26, such that the transverse member 28 bridges between the side members 26, by means of the locking mechanisms 34, without detaching any of the side members 26 from the side walls 18.

In order to remove one of the electric module cards 14 from the housing 12, e.g., for replacement or repair, the snap-fit connection of each locking mechanism 34 is released and the transverse members 28 are removed.

Figure 2:
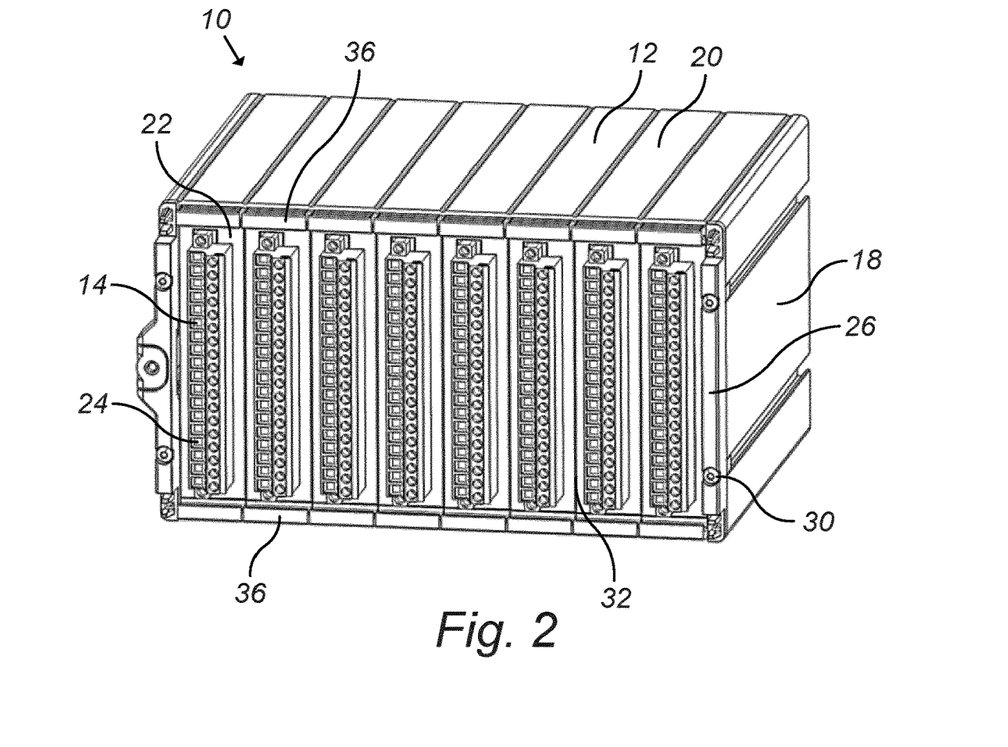
FIG. 2: schematically represents a perspective front view of the electric device where two transverse members of the locking arrangement have been removed.

FIG. 2 schematically represents a perspective front view of the electric device 10 where the two transverse members 28 of the locking arrangement 16 have been removed. As shown in FIG. 2, each back plate 22 comprises two grip features 36. The grip features 36 are covered by the transverse members 28 when the transverse members 28 are connected between the side members 26. Thus, for each electric module card 14, one grip feature 36 is arranged adjacent to the top wall 20 and one grip feature 36 is arranged adjacent to the bottom wall. In this example, each grip feature 36 is a recess for receiving human fingers.

Since the transverse members 28 no longer block the back plates 22 of the electric module cards 14, one, several or all of the electric module cards 14 can be pulled out from the housing 12. For each electric module cards 14 that is not replaced, each cable to the electric contacts 24 can be maintained connected.

Once one or more new electric module cards 14 have been inserted into the housing 12, the transverse members 28 are again connected to the side members 26 to form the frame illustrated in FIG. 1 by means of the snap-fit connection of the locking mechanisms 34. No tools are required for this.

Figure 3:
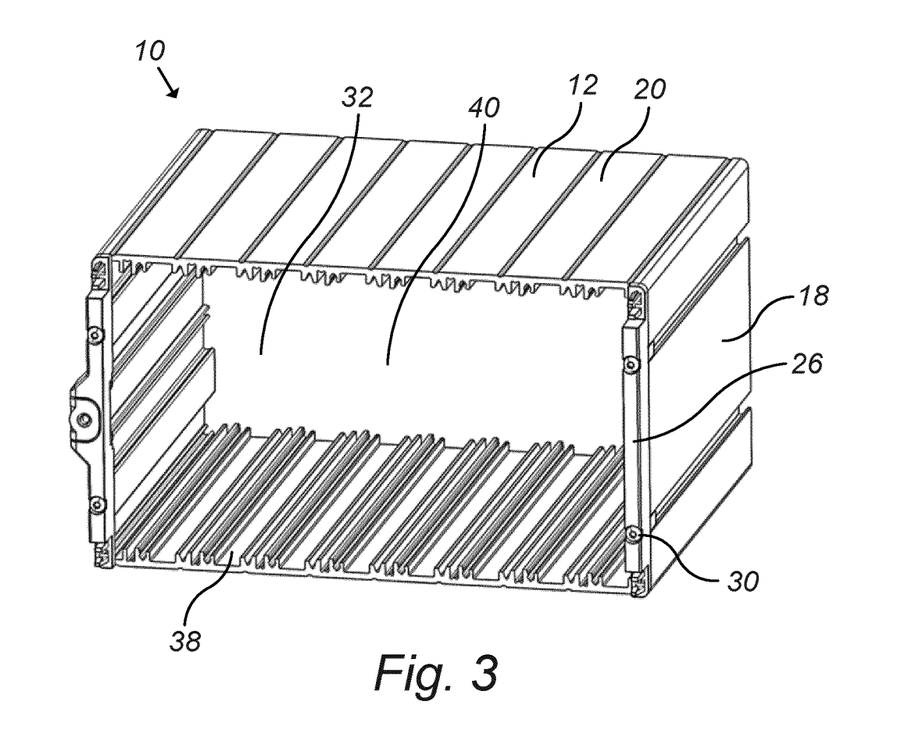
FIG. 3: schematically represents a perspective front view of the electric device where electric module cards have been removed.

FIG. 3 schematically represents a perspective front view of the electric device 10 in a case where all electric module cards 14 have been removed. In FIG. 3, the bottom wall 38 and the space 40 defined between the two side walls 18 and the bottom wall 38 can be seen. Furthermore, the bottom wall 38 can be seen in FIG. 3. The top wall 20 spans between a top of each side wall 18 and the bottom wall 38 spans between a bottom of each side wall 18.

Figure 5:
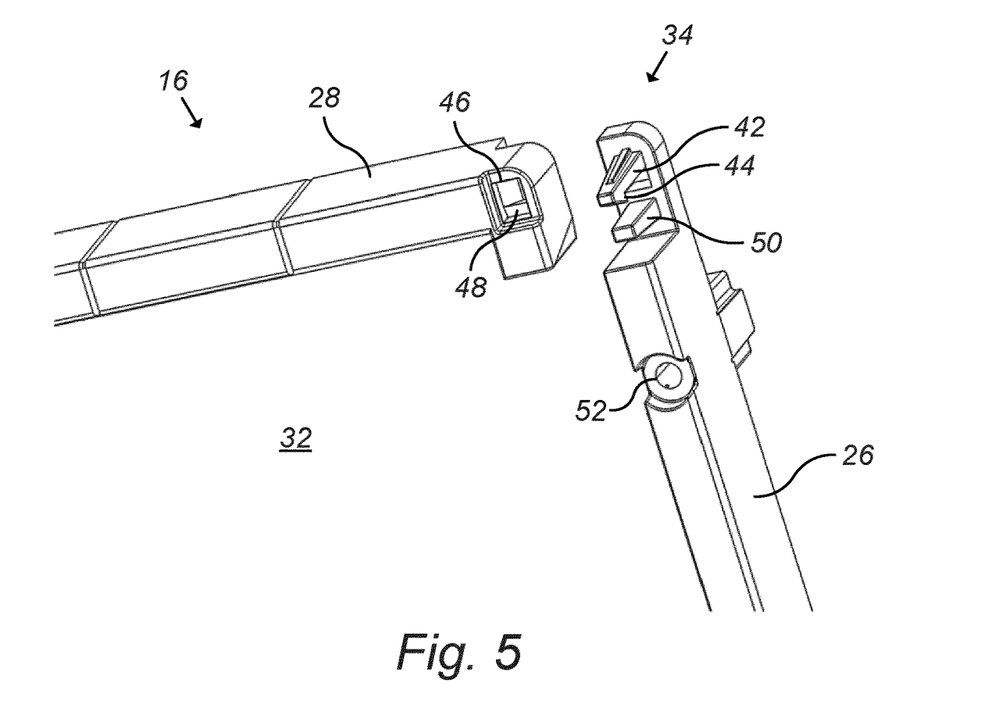
FIG. 5 schematically represents a partial perspective front view of the locking arrangement where a transverse member has been detached from a side member.

FIG. 4 schematically represents a partial perspective front view of the locking arrangement 16, and FIG. 5 schematically represents a partial perspective front view of the locking arrangement 16 where the transverse member 28 has been detached from the side member 26. With collective reference to FIGS. 4 and 5, the locking mechanism 34 comprises a flexible locking element 42, here exemplified as a tongue. The locking element 42 comprises a hook 44 at a distal end thereof.

The locking mechanism 34 further comprises a hole 46 and a wedge 48 inside the hole 46. The locking mechanism 34 further comprises an optional guiding pin 50 and an aperture (not shown) for receiving the guiding pin 50.

In the example in FIGS. 4 and 5, the hole 46 and wedge 48 are provided on the transverse member 28. The locking element 42 and the guiding pin 50 are provided on the side member 26.

In order to connect the transverse member 28 to the side member 26 by means of the snap-fit of the locking mechanism 34, the transverse member 28 is moved to the side member 26 such that the locking element 42 enters the hole 46 until the hook 44 snaps over the wedge 48 (and such that the guiding pin 50 enters the aperture). In this state, as illustrated in FIG. 4, the locking element 42 protrudes out from the hole 46 and is thereby accessible for a human finger. By means of a slight push on the locking element 42, the engagement between the hook 44 and the wedge 48 can be released and the transverse member 28 can be detached from the side member 26. Thus, the locking mechanism 34 enable a toolless connection and disconnection of the transverse member 28 to and from the side member 26.

In this example, the hole 46 also provides access for a flat-bladed screw driver or other tool that can be inserted into the hole 46 and turned in order to release the snap-fit of the locking mechanism 34. In FIGS. 4 and 5, one of the screw holes 52 for the screw 30 is also shown.

Figure 6:
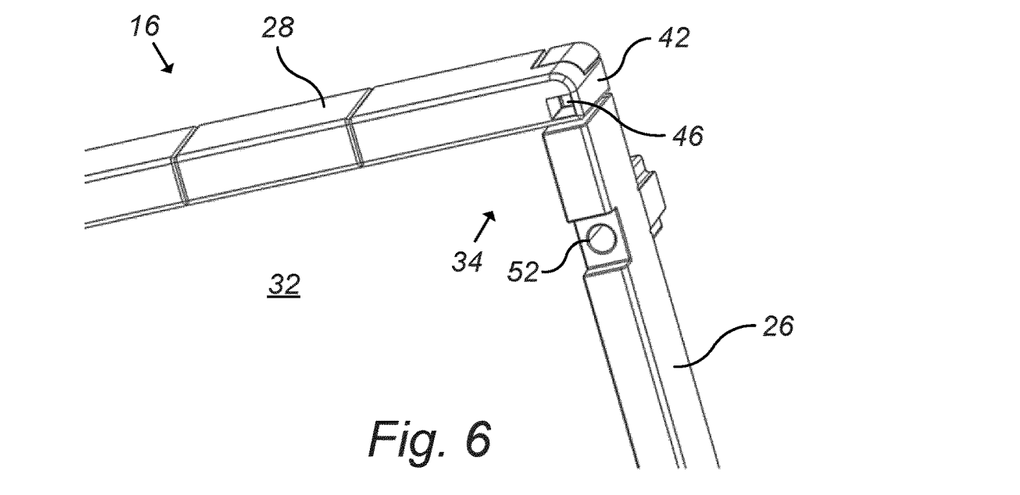
FIG. 6 schematically represents a partial perspective front view of an alternative locking arrangement.
Figure 7:
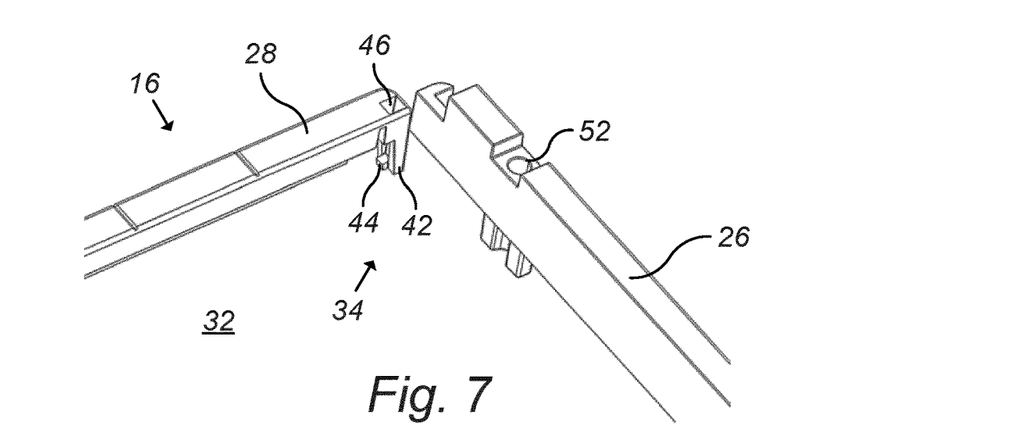
FIG. 7 schematically represents a partial perspective front view of the locking arrangement in FIG. 6 where a transverse member has been detached from a side member.
Figure 8:
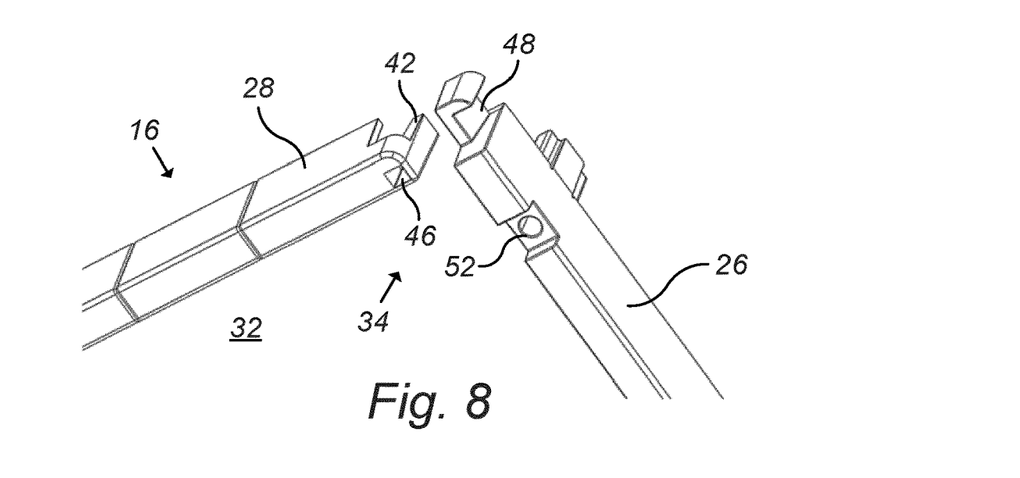
FIG. 8 schematically represents a further partial perspective front view of the locking arrangement in FIG. 7.

FIG. 6 schematically represents a partial perspective front view of an alternative locking arrangement 16, FIG. 7 schematically represents a partial perspective front view of the locking arrangement 16 in FIG. 6 where the transverse member 28 has been detached from the side member 26, and FIG. 8 schematically represents a further partial perspective front view of the locking arrangement 16 in FIG. 7. With collective reference to FIGS. 6-8, mainly differences with respect to FIGS. 4 and 5 will be described.

In the locking arrangement 16 in FIGS. 6-8, the locking element 42 and the hole 46 are provided on the transverse member 28 and the wedge 48 is provided on the side member 26. As shown in the closed state of the locking mechanism 34 in FIG. 6, the locking element 42 is arranged at an exterior part of the transverse member 28. The locking element 42 is thereby accessible for a human finger on the side of the side member 26. Thus, also the locking mechanism 34 in FIGS. 6-8 enables toolless handling. However, a tool, such as a flat-bladed screw drive, can be inserted into the hole 46 and be twisted to release the snap-fit.

It will be appreciated that the transverse member 28 may be attached to two side members 26 arranged at opposite sides of the opening 32 of the housing by means of a locking mechanism 34 employing a snap-fit joint as previously described and a protruding element fitting in a recess, such as a tongue and groove joint. A first end portion of the transverse member 28 may be attached to a first one of the side members 26 by the tongue and groove joint, whereas a second end portion of the transverse member 28 may be attached to another one of the side members 26 by means of the snap-fit joint. In some examples, the locking arrangement 16 may comprise two transverse members 28, wherein a first one of the transverse members 28 may be arranged at an end portion of the top wall of the housing by means of a locking mechanism 34 as outlined above, and a second one of the transverse members 28 may be arranged at an end portion of the bottom wall of the housing by means of a locking mechanism 34 similar to the one outlined above.

Figure 9:
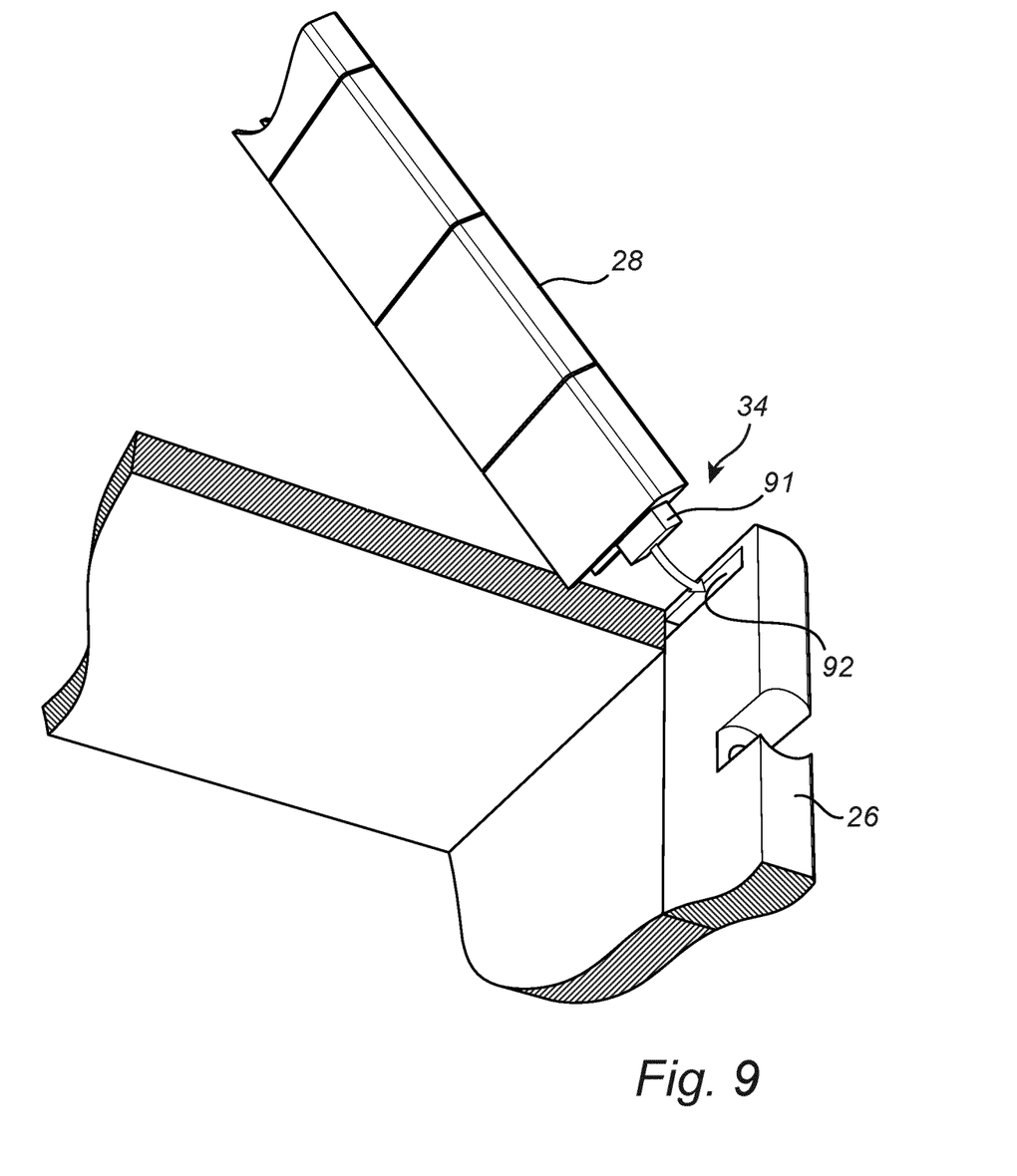
FIG. 9 schematically represents a further partial perspective front view of a locking arrangement according to an example.

In FIG. 9, an example of a locking mechanism 34 comprising a protruding element and a recess, forming a tongue and groove joint, is illustrated. In the present example, the transverse member 28 may comprise a protruding part, such as a tongue 91, which may have a shape and size that allows it to be at least partly fitted in a corresponding recess, or groove 92 of the side member 26. Alternative arrangements are however also possible, in which the recess 92 is arranged in the transverse member 28 and the protruding part arranged at the side member 26.

While the present disclosure has been described with reference to exemplary embodiments, it will be appreciated that the present invention is not limited to what has been described above. For example, it will be appreciated that the dimensions of the parts may be varied as needed. Accordingly, it is intended that the present invention may be limited only by the scope of the claims appended hereto.

The invention claimed is:

1. A locking arrangement for securing electric module cards between two side walls of a housing, the locking arrangement comprising:
   two side members for fixed arrangement with the respective side walls;
   an opening for accommodating electric contacts of the electric module cards, the opening defined between the side members;
   a first and a second transverse member forming a frame with the side members in order to lock the electric module cards within the housing; and
   a locking mechanism detachably connecting at least one of the transverse members to at least one of the side members by means of a snap-fit.

2. The locking arrangement according to claim 1, wherein each of the transverse members is elongated and/or each side member is elongated.

3. The locking arrangement according to claim 1, wherein the opening of the housing is defined by the frame.

4. The locking arrangement according to claim 1, wherein the locking mechanism comprises a separate locking mechanism at each connection between the at least one of the transverse members and the side members.

5. The locking arrangement according to claim 1, wherein the locking mechanism comprises a flexible locking element.

6. The locking arrangement according to claim 5, wherein the locking element is configured to be released by means of a human finger when the at least one of the transverse members is connected to the side members.

7. The locking arrangement according to claim 1, wherein the locking mechanism is configured to detachably connect the at least one of the transverse members to a first one of the side members by means of a tongue and groove joint and to the other one of the side members by means of the snap-fit.

8. The locking arrangement according to claim 7, wherein the snap-fit is formed of a protruding edge and a recess configured to be engaged with each other.

9. The locking arrangement according to claim 7, wherein the tongue and groove joint is formed by a tongue of the at least one of the transverse members and a groove of the first one of the side members, or by a tongue of the first one of the side members and a groove of the at least one of the transverse members.

10. The locking arrangement according to claim 1, wherein the side members are detachably connectable to the respective side walls.

11. A housing for accommodating electric module cards, the housing comprising:
   two side walls; and a locking arrangement for securing the electric module cards between the two side walls, the locking arrangement comprising:
- two members, each side member fixedly connected to a respective one of the side walls;
- an opening for accommodating electric contacts of the electric module cards defined between the side members;
- a first and a second transverse member forming a frame with the side members in order to lock the electric module cards within the housing; and
- a locking mechanism detachably connecting at least one of the transverse members to at least one of the side members by means of a snap-fit.

12. The housing according to claim 11, wherein the at least one of the transverse members can be connected to the side members by means of the locking mechanism, and can be detached from the side members by means of the locking mechanism, without detaching any of the side members from the respective side wall.

13. An electric device comprising:
- a housing that includes two side walls disposed between a top wall and a bottom wall;
- two side members, each side member fixedly connected with a respective side wall;
- an opening defined between the side members;
- an electronic module card located in the opening;
- a first and a second transverse member forming a frame with the side members in order to lock the electric module card within the housing; and
- a locking mechanism detachably connecting at least one of the transverse members to at least one of the side members by means of a snap-fit.

14. The electric device according to claim 13, comprising a plurality of electric module cards accommodated between the two side walls.

15. The electric device according to claim 14, wherein at least one electric module card comprises a back plate, and wherein the transverse members are configured to lock the at least one electric module card within the housing by locking the back plate.

16. The electric device according to claim 13, wherein the locking mechanism comprises a separate locking mechanism at each connection between the at least one of the transverse members and the side members.

17. The electric device according to claim 13, wherein the locking mechanism comprises a flexible locking element.

18. The electric device according to claim 17, wherein the locking element is configured to be released by means of a human finger when the at least one of the transverse members is connected to the side members.

19. The electric device according to claim 13, wherein the locking mechanism is configured to detachably connect the at least one of the transverse members to a first one of the side members by means of a tongue and groove joint and to the other one of the side members by means of the snap-fit.

20. The electric device according to claim 13, wherein the side members are detachably connectable to the respective side walls.

* * * * *